ns the United States Patent [19]
LeGall et al.

[11] Patent Number: 5,128,791
[45] Date of Patent: Jul. 7, 1992

[54] MULTI-CHANNEL HDTV SYSTEM
[75] Inventors: Didier J. LeGall, Los Altos, Calif.; Martin Vetterli, New York, N.Y.
[73] Assignee: Bell Communications Research, Inc., Livingston, N.J.
[21] Appl. No.: 566,831
[22] Filed: Aug. 13, 1990
[51] Int. Cl.⁵ .......................... H04N 7/04; H04N 7/01
[52] U.S. Cl. ...................................... 358/141; 358/140
[58] Field of Search .................. 358/141, 12, 138, 133, 358/142, 135, 140, 137, 11

[56] References Cited
U.S. PATENT DOCUMENTS

| | | | |
|---|---|---|---|
| 4,621,286 | 11/1986 | Reitmeier et al. | 358/12 |
| 4,622,578 | 11/1986 | Rzeszewski | 358/12 |
| 4,713,688 | 12/1987 | Güttner | 358/141 |
| 4,829,378 | 5/1989 | LeGall | 358/141 |
| 4,866,519 | 9/1989 | Lucas et al. | 358/141 |
| 4,918,524 | 4/1990 | Ansari et al. | 358/133 |
| 4,965,661 | 10/1990 | Lucas | 358/12 |

OTHER PUBLICATIONS

"Trans. of HDTV Sig. Under 140 Mbit/s Using a subband Decomposition & Discrete Cosine Transform Coding", LeGall, Gaggioni & Chen, Signal Processing of HDTV, pp. 287-293, Chiariglione, ed., N-Holland, 1988.
"HDTV Coding Using a Non-Rectangular Subband Decomposition", R. Ansari et al, SPIE Conf. on Visual Com. and Image Proc., vol. 1001, pp. 821-824, Cambridge, Nov. 1988.
"Encoding for Compatibility and Recoverability in the ACT System", M. Isnardi et al, IEEE Transactions on Broadcasting, vol. BC-33, No. 4, pp. 116-123, Dec. 1987.
"ENTSC Two-Channel Compatible HDTV System", M. Tsinberg, IEEE Trans. on Consumer Electronics, vol. CE-33, No. 3, pp. 146-153, Aug. 1987.
"Quadrature Mirror Filter Banks, M-band Extensions and Perfect Reconstruction Techniques", P. P. Vaidyanathan, IEEE ASSP Magazine, vol. 4, No. 3, pp. 4-20, Jul. 1987.
"The Role of Lossless Systems in Modern Digital Signal Processing: A Tutorial", P. P. Vaidyanathan et al, IEEE Transactions on Education, vol. 32, No. 3, pp. 181-197, Aug. 1989.
"Perfect Reconstruction FIR Filter Banks: Some Properties and Factorizations", M. Vetterli et al, IEEE Trans. on ASSP, vol. 37, No. 7, pp. 1057-1071, Jul. 1989.
"Orthogonal Pyramid Transforms for Image Coding", E. H. Adelson et al, Proc. of SPIE on Visual Communications and Image Processing II, pp. 50-58, 1987.
"Two Dimensional IIR Filters for Exact Reconstruction in Tree-structured Subband Decomp.", R. Ansari et al, Electronics Letters, vol. 23, No. 12, pp. 633-634, Jun. 1987.

(List continued on next page.)

Primary Examiner—James J. Groody
Assistant Examiner—Michael H. Lee
Attorney, Agent, or Firm—Leonard Charles Suchyta; Loria J. Baskerville

[57] ABSTRACT

A filter bank comprising first and second finite impulse response diamond-shaped filters with finite precision filter coefficients is used to convert a high definition progressive video sequence in a vertical-time representation into an interlaced sequence and a deinterlacing sequence. The interlaced sequence may be used by a low resolution television receiver to display a low resolution television image. The interlaced and deinterlacing sequences may be recombined to perfectly reconstruct the progressive high definition video sequence which then may be used by a high definition television receiver. Thus, the inventive system has the advantage that it enables a single high definition video sequence to be utilized by both high definition television equipment and lower resolution television equipment so that an existing base of consumer television equipment is not rendered obsolete by the introduction of a high definition television sequence.

22 Claims, 6 Drawing Sheets

OTHER PUBLICATIONS

"Theory of Two-Dimensional Multirate Filter Banks", G. Karlson et al, IEEE Trans. on ASSP, vol. 38, No. 6, pp. 925-937, Jun. 1990.

"Channel Compatible 6-Mhz HDTV Distribution Systems", W. F. Schreiber et al, ATRP Tech. Rep. No. 79, MIT, Jan. 1988.

"The Analysis and Design of Multidimensional FIR Perfect Reconstruction Filter Banks for Arbitrary Sampling Lattices", Eviscito et al, IEEE TRans. CAS, pp. 1-36.

Heinz Sauerburg (VDE/NTG), Ludwig Stenger (VDE/NTG) Preprocessing and Digital Encoding of HDTV Signal, Nov.-Dec., 1983.

G. J. Tonge, B.Sc. Ph.D., The Sampling of T.V. Images.

MULTI-CHANNEL HDTV SYSTEM

FIELD OF THE INVENTION

The present invention relates to a system including a unique filter bank which permits a high definition television signal to be utilized by low resolution receivers as well as high definition receivers. Thus, use of the present invention permits broadcasters to utilize high definition television signals without rendering an installed base of existing lower resolution television receivers obsolete.

BACKGROUND OF THE INVENTION

Filter banks have emerged as useful tools in video signal processing. In particular, filter banks can be utilized to create a hierarchy of video sequences from a single high definition sequence, such that the individual channels in the hierarchy are compatible with various classes of existing television receivers. (See, W. F. Schreiber et al, "Channel Compatible 6-Mhz HDTV Distribution Systems," ATRP Tech. Rep. No. 79, MIT, Jan., 1988.)

Filter banks are central to subband coding techniques which have been used successfully in HDTV compression. (See, D. J. LeGall, H. Gaggioni and C. T. Chen, "Transmission of HDTV Signals Under 140 Mbit/s Using a Subband Decomposition and Discrete Cosine Transform Coding," in "Signal Processing of HDTV", pp. 287-293, L. Chiariglione, ed., North-Holland, 1988; R. Ansari, H. Gaggioni and D. LeGall, "HDTV Coding Using a Non-rectangular Subband Decomposition," SPIE Conf. on Visual Com. and Image Proc., Nov., 1988, Cambridge, Vol. 1001, pp. 821-824.) In a subband system, an analysis filter bank is used at a transmitter to decompose an HDTV sequence into a plurality of subband sequences, each of which is individually coded and transmitted. At a receiver, the individual subband sequences are decoded and recombined using a synthesis filter bank to reconstruct the image. Typically, in such a system, an HDTV sequence is first divided into low and high frequency subbands in the horizontal direction, and each of these subbands is then divided into low and high frequency subbands in the vertical direction, i.e., the analysis filter bank is "separable". While this type of scheme is highly advantageous for the compression of an HDTV video sequence, it does not result in a hierarchy of sequences which can be utilized by different classes of receivers.

A progressive video sequence is one in which each vertical-horizontal frame includes samples on all lines, while in an interlaced video sequence, in each frame there are samples on alternate lines. (Such frames wherein there are samples only on alternate lines are called fields.)

One non-separable filtering scheme of interest for television is quincunx subsampling over the vertical-time plane, since this allows one to go from a progressive sequence to an interlaced sequence and from an interlaced sequence to a progressive sequence. In quincunx subsampling every other sample is removed from each line, so that, for example, in the even numbered lines the even numbered samples are removed and in the odd numbered lines the odd numbered samples are removed.

To go from a progressive to an interlaced sequence, a progressive sequence is filtered in the vertical-time plane with a low pass filter having a diamond-shaped pass band and then quincunx subsampled to yield an interlaced sequence. A complementary sequence obtained with a high pass filter and also quincunx subsampled is known as a deinterlacing or helper sequence. If the interlaced and deinterlacing sequences can be recombined to perfectly reconstruct the original progressive sequence, then the same progressive sequence may be utilized for both a high resolution receiver (reconstructed version) and a lower resolution receiver (interlaced sequence by itself). Previous attempts to develop filter banks for this application (see, M. Isnardi, J. S. Fuhrer, T. R. Smith, J. L. Koslov, B. J. Roeder and W. F. Wedam, "Encoding for Compatibility and Recoverability in the ACTSystem," IEEE Transactions on Broadcasting, Vol. BC-33, No. 4, pp. 116-123, Dec. 1987; M. Tsinberg, "ENTSC Two-Channel Compatible HDTV System," IEEE Trans. on Consumer Electronics, Vol. CE-33, No. 3, pp. 146-153, Aug. 1987) have proven to be unsatisfactory because of the inability to perfectly recover the progressive sequence from the interlaced and deinterlacing sequences.

The design of perfect reconstruction filter banks has been extensively considered for the one dimensional case (see, P. P. Vaidyanathan, "Quadrature Mirror Filter Banks, M-band Extensions and Perfect Reconstruction Technique," IEEE ASSP Magazine, Vol. 4, No. 3, pp. 4-20, Jul. 1987; P. P. Vaidyanathan and Z. Doganata, "The Role of Lossless Systems in Modern Digital Signal Processing: A Tutorial," IEEE Transactions on Education, Vol. 32, No. 3, pp. 181-197, Aug. 1989; M. Vetterli and D. LeGall, "Perfect Reconstruction FIR Filter Banks: Some Properties and Factorizations," IEEE Trans. on ASSP, Vol. 37, No. 7, Ju. 1989, pp. 1057-1071). In two dimensions, some initial designs have been produced (see, E. H. Adelson and E. Simoncelli, "Orthogonal Pyramid Transforms for Image Coding," Proc. of SPIE on Visual Communications and Signal Processing, pp. 50-58, 1987; R. Ansari, "Two Dimensional IIR Filters for Exact Reconstruction in Tree-structured Subband Decomposition," Electronics Letters, Vol. 23, No. 12, Jun. 1987, pp. 633-634; G. Karlsson and M. Vetterli, "Theory of Two-dimensional Multirate Filter Banks," to appear in IEEE Trans. on ASSP, Jun. 1990; E. Viscito and J. Allebach, "The Analysis and Design of Multidimensional FIR perfect Reconstruction Filter Banks for Arbitrary Sampling Lattices," submitted for publication). However, these filters either do not perform satisfactorily (i.e. the reconstruction is not sufficiently perfect) or are not practical from an implementation standpoint. In particular, some of the prior art filters do not have finite precision filter coefficients. Other prior art filters are non-causal, i.e., they are infinite impulse response filters and thus are not suitable for use in the vertical-time plane.

Accordingly, it is an object of the present invention to provide a system, including easily implementable filter banks which have small size and finite precision filter coefficients, for converting a progressive sequence into an interlaced sequence and a deinterlacing sequence and for perfectly reconstructing the progressive sequence from the interlaced and deinterlaced sequences, so as to enable a single high definition television signal to be utilized by both a low definition interlaced receiver and a high definition progressive receiver.

SUMMARY OF THE INVENTION

In an illustrative embodiment of the invention, an analysis filter bank, comprising first and second finite impulse response filters with simple finite precision filter coefficients, is used to convert a high definition progressive video sequence in a vertical-time representation into an interlaced sequence and a deinterlacing sequence. The first filter in the analysis filter bank is a low pass filter with a substantially diamond-shaped pass band and the second filter is a high pass filter with a substantially diamond-shaped stop band. The interlaced sequence produced by the analysis filter bank may be used by a lower resolution television receiver to display a lower resolution image. To display a high definition television image, a synthesis filter bank, comprising third and fourth finite impulse response filters with simple finite precision filter coefficients, is used at a high definition television receiver to reconstruct the high definition progressive video sequence in the vertical-time representation from the interlaced and deinterlacing sequences. In the synthesis filter bank, the third filter is a low pass filter with a substantially diamond-shaped pass band and the fourth filter is a high pass filter with a substantially diamond-shaped stop band.

It is an important advantage that the finite impulse response diamond-shaped filters of the present invention permit a perfect reconstruction of the high definition progressive video sequence from the interlaced and deinterlacing sequences. By perfect reconstruction it is meant that the reconstruction sequence produces a high quality visually pleasing television image. Without this perfect reconstruction property, it would not be possible to utilize a single high definition video sequence to transmit simultaneously to both low resolution interlaced television receivers and high definition progressive television receivers. This property has not been realized in a satisfactory fashion by any of the prior art filter structures mentioned above.

The filters used in the analysis and synthesis filter banks may be paraunitary or linear phase. In addition, the filters are of small size and low complexity because of the use of finite precision filter coefficients.

In an alternative embodiment of the invention, an additional analysis filter bank comprising fifth and sixth finite impulse response filters with finite precision coefficients may be utilized to convert the interlaced sequence into two progressive sequences of still lower resolution. The fifth filter is a low pass filter with a substantially diamond-shaped pass band and the sixth filter is a high pass filter with a substantially diamond-shaped stop band.

In short, the filter banks of the present invention can be utilized to create a hierarchy of sequences of different resolutions which can be utilized by corresponding television receivers. Accordingly, the present invention permits an evolutionary process towards the deployment of HDTV without rendering the existing base of installed television receivers obsolete.

DETAILED DESCRIPTION OF THE INVENTION

Before describing the present invention in detail, it will be helpful to describe some properties of high definition television signals.

Figure 1:
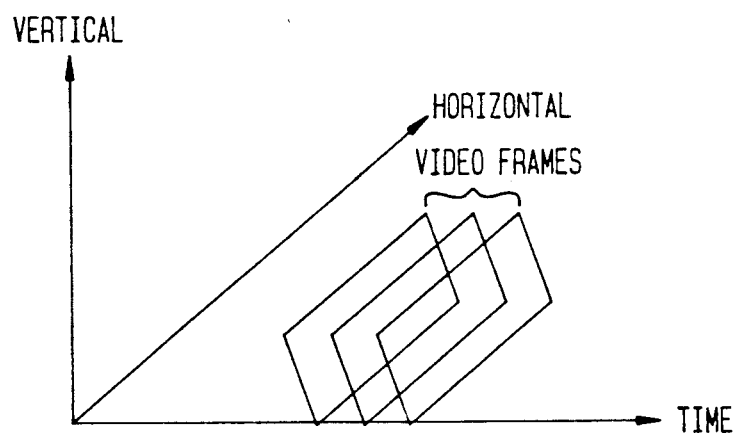
FIG. 1 illustrates a group of video frames.

FIG. 1 shows a coordinate system defined by time, vertical and horizontal axes. A plurality of video frames are illustrated with respect to this coordinate system. The frames may correspond to a progressive or to an interlaced video sequence.

Figure 2:
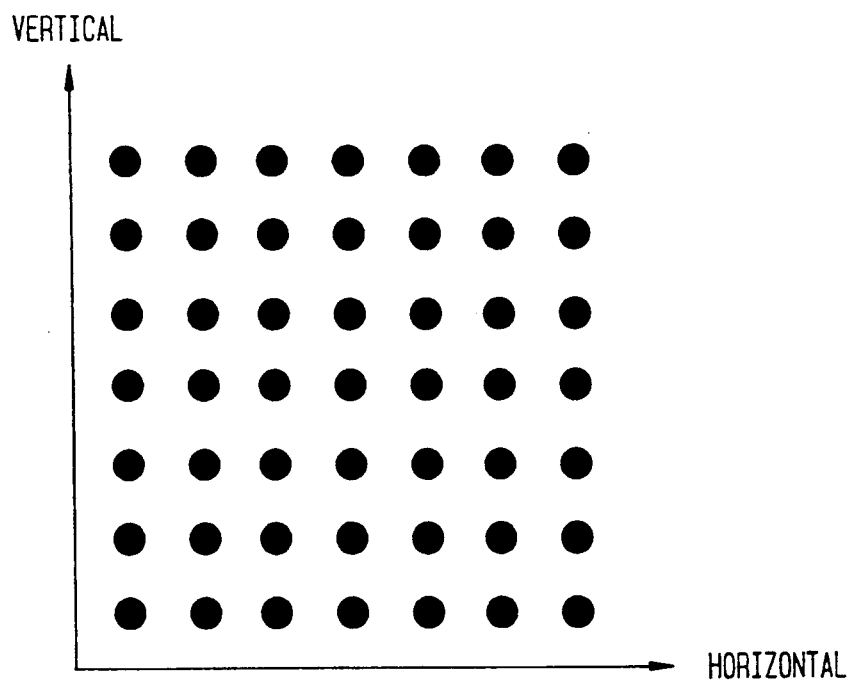
FIG. 2 illustrates a progressive sequence in a vertical-horizontal representation.

A progressive frame as seen in the vertical-horizontal plane is shown in FIG. 2. In FIG. 2, each "dot" represents one sample of the video sequence. As indicated by the dots in FIG. 2, each line in the frame contains signal samples.

Figure 3B:
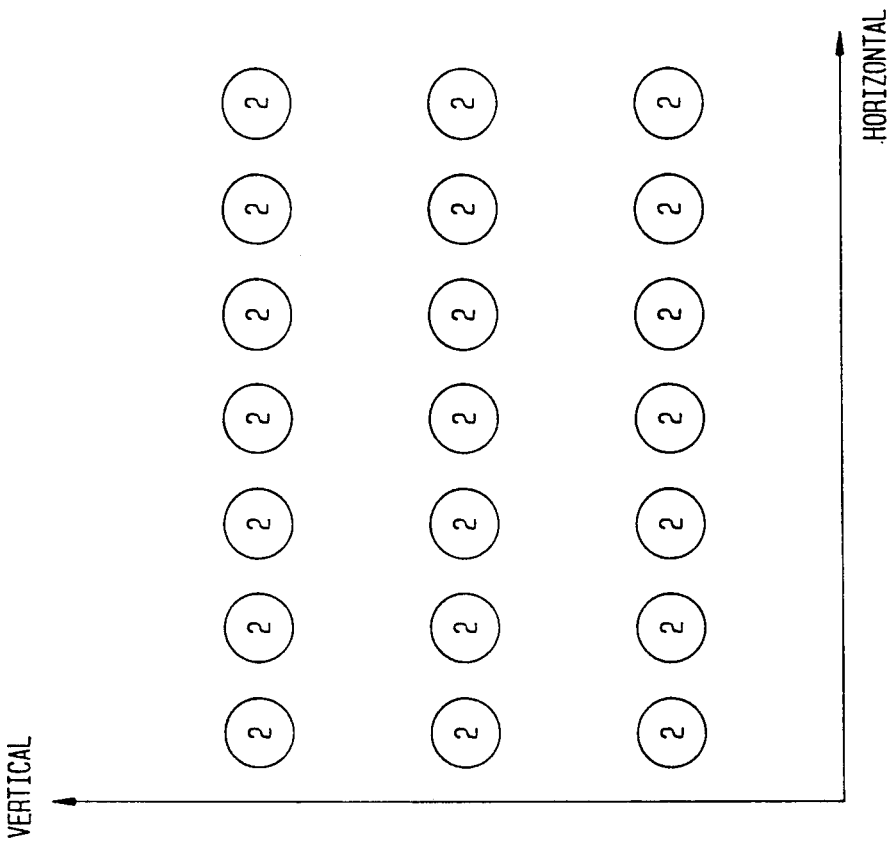
FIGS. 3A and 3B illustrate an interlaced sequence in a vertical-horizontal representation.
Figure 3A:
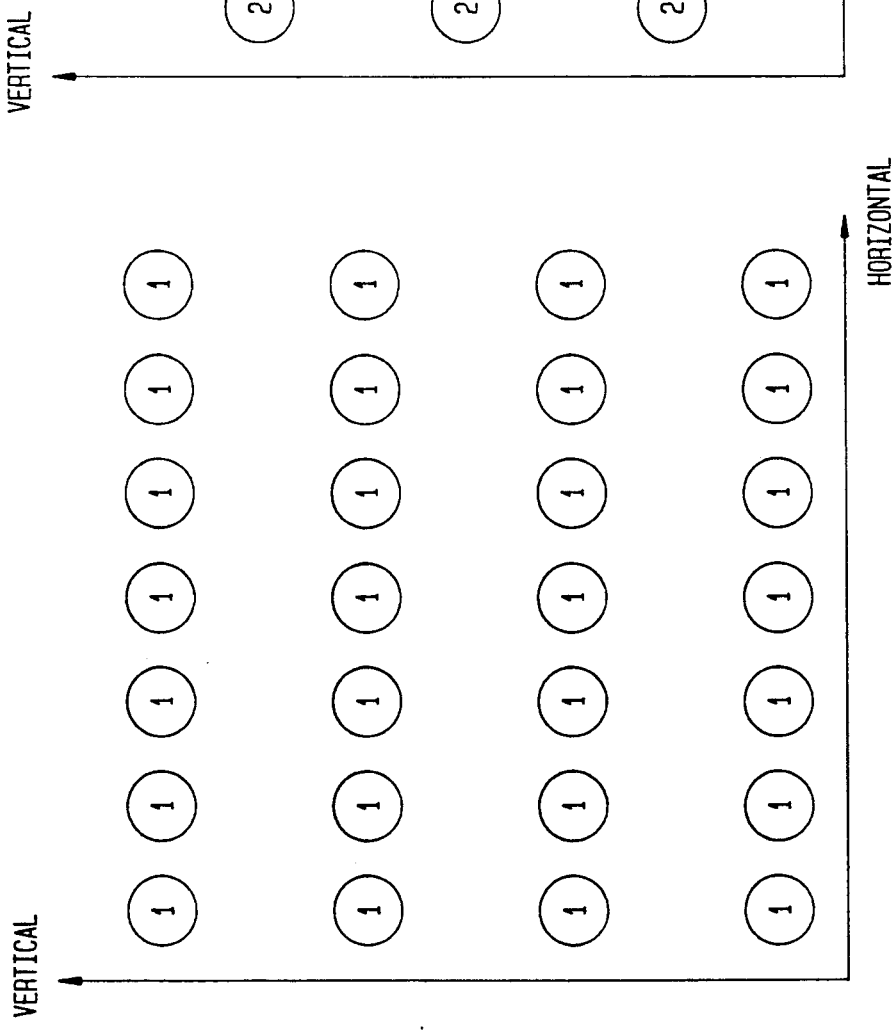

Two successive interlaced frames as seen in the vertical-horizontal plane are illustrated in FIGS. 3A and 3B. In each of the interlaced frames, there are signal samples on every other line, with the odd-numbered lines containing samples in one frame and the even-numbered lines containing samples in the next frame as indicated by the circled 1's in FIG. 3A and the circled 2's in FIG. 3B.

Figure 4A:
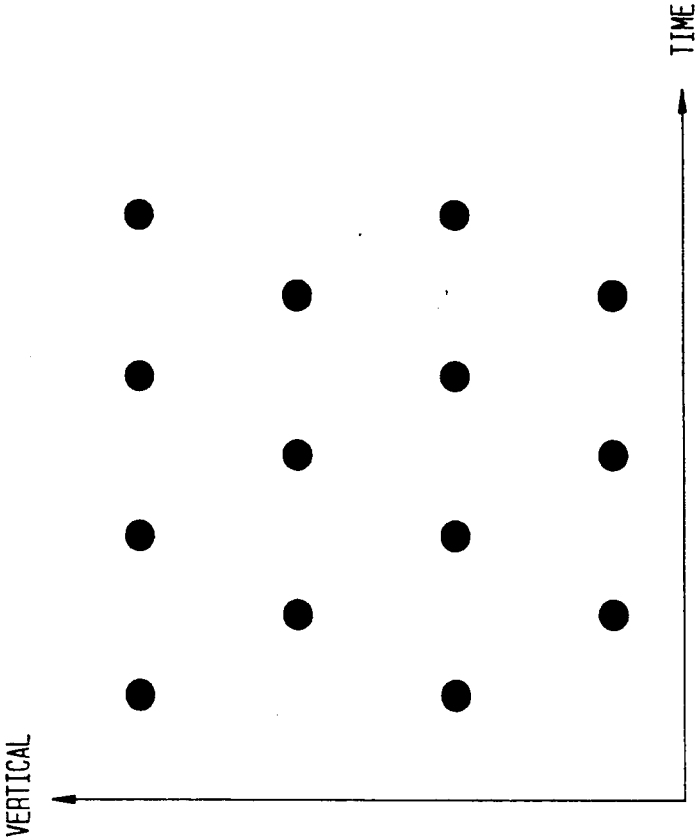
FIGS. 4A and 4B illustrate a progressive sequence and an interlaced sequence, respectively, in a vertical time representation.
Figure 4B:
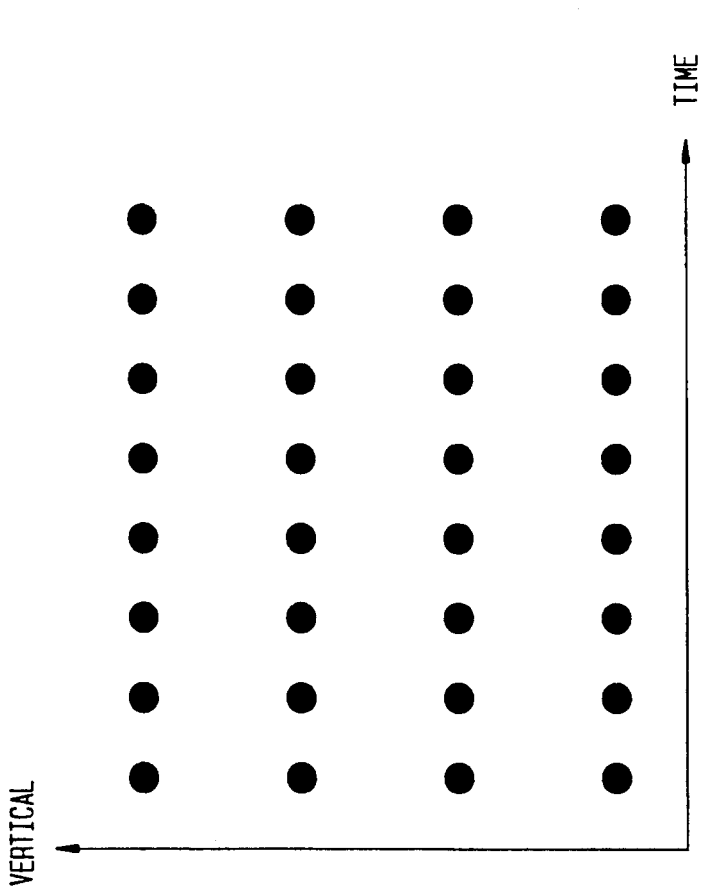

Instead of looking at a video signal in the vertical-horizontal representation, it is also possible to consider a video signal in the vertical-time representation. To consider a video signal in the vertical-time representation, a memory is utilized to store a sequence of the video frames shown in FIG. 1. FIG. 4A shows a progressive signal in the vertical-time representation and FIG. 4B shows an interlaced signal in the vertical-time representation. The pattern of samples in FIG. 4B is known as the quincunx pattern. To go from a progressive sequence as shown in FIG. 4A to an interlaced sequence as shown in FIG. 4B, a quincunx sampler is utilized to remove every other sample from each line of FIG. 4A. The odd-numbered samples are removed from one line and the even-numbered samples are removed from the next line.

Figure 5:
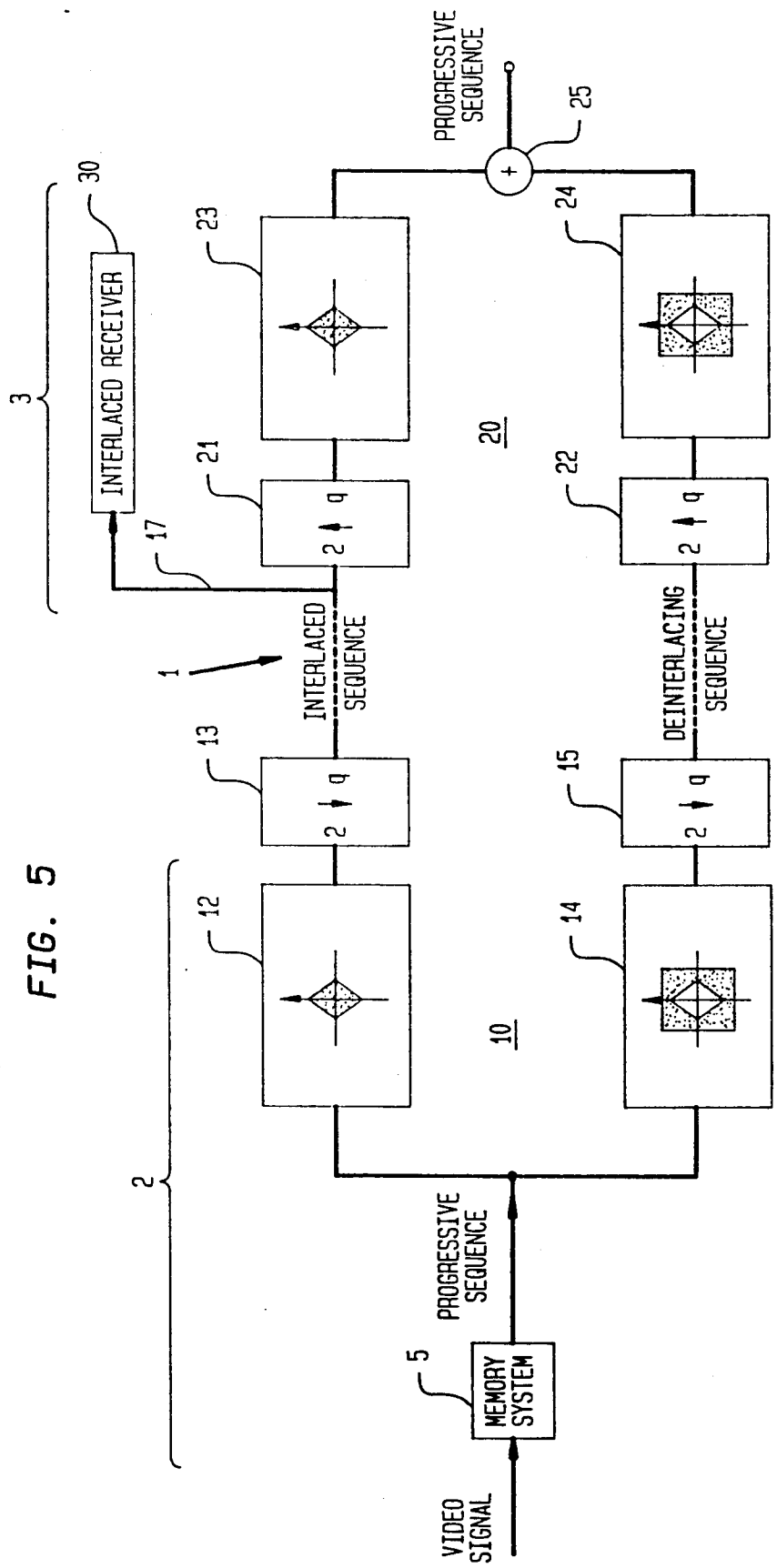
FIG. 5 illustrates a system comprising analysis and synthesis filter banks for converting a progressive sequence into an interlaced sequence and a deinterlacing sequence and for reconstructing the progressive sequence from the interlaced and deinterlacing sequences, in accordance with an illustrative embodiment of the present invention.

FIG. 5 schematically illustrates a filter system 1 for converting a progressive video sequence into an interlaced sequence and a deinterlacing sequence and for reconstructing the progressive sequence from the interlaced and deinterlacing sequences. The system 1 includes a transmitter end 2 and a receiver end 3.

The transmitter end 2 is considered first. Illustratively, a plurality of frames of a high definition progressive video sequence is stored in a memory system 5 to form a vertical-time representation of the progressive video sequence as shown in FIG. 4A. The progressive video sequence in the vertical-time representation is filtered by an analysis filter bank 10.

The analysis filter bank 10 comprises the filters 12 and 14. Illustratively, the filter 12 is a finite impulse response filter with simple finite precision filter coefficients. In the frequency domain, the filter 12 is a low pass filter in the vertical and time dimensions as indicated by the shading in the box 12 of FIG. 5. The sequence at the output of the filter 12 is quincunx subsampled as indicated by the box 13 to form an interlaced sequence. A deinterlacing or helping sequence is formed using the filter 14. In the frequency domain, the filter 14 is a high pass filter in the vertical and time dimensions as indicated by the shading in FIG. 5. The output of the filter 14 is quincunx subsampled as indicated by the box 15 to form the deinterlacing or helping sequence.

Figure 6A:
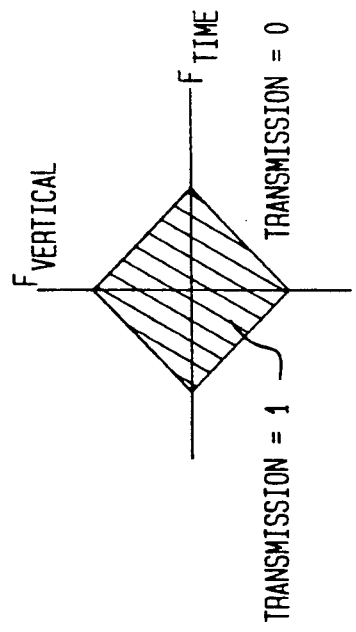
FIGS. 6A and 6B illustrate the pass bands of the filters utilized in the analysis filter bank of FIG. 5.
Figure 6B:
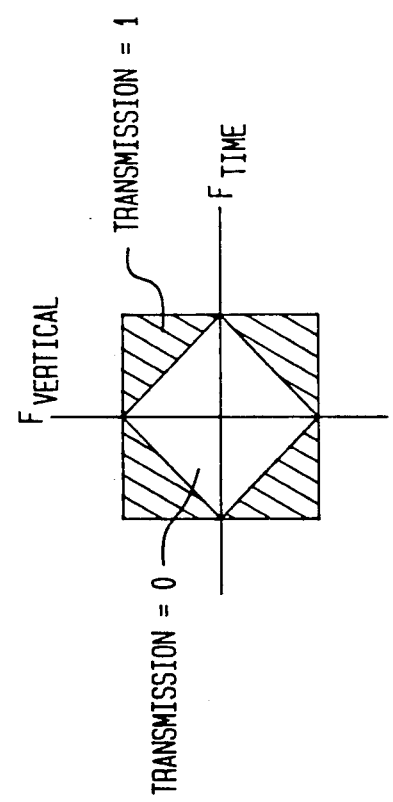

FIGS. 6A and 6B illustrate the transmission bands of the filters 12 and 14, respectively. In FIGS. 6A and 6B $f_{vertical}$ and $f_{time}$ represent frequency variables in the vertical and time dimensions, respectively. The filter 12 is low pass in the vertical and time dimensions and thus has an approximately diamond-shaped frequency pass band as shown by the shading in FIG. 6A. The filter 14 is high pass in the vertical and time dimensions as indicated by the shading in FIG. 6B. Therefore, the filter 14 has an approximately diamond-shaped stop band.

As shown in FIG. 5, the interlaced sequence may be transmitted directly to a relatively low resolution interlaced receiver 30 via line 17. To accomplish this, the interlaced signal may be coded at the transmitter end for purposes of compression and then decoded at the receiver 30.

The interlaced and deinterlacing sequences may be recombined to reform the progressive sequence using the synthesis filter bank 20 located at the receiver end 3 of the filter system 1. To transmit the interlaced and deinterlacing sequences from the transmitter end 2 to the receiver end 3, the interlaced and deinterlacing sequences may be separately coded at the transmitter end for purposes of compression and then decoded at the receiver end.

At the synthesis filter bank 20, the interlaced and deinterlacing sequences are upsampled as indicated by the boxes 21 and 22. Upsampling involves inserting samples with the value zero for the missing samples in the quincunx sampled interlaced and deinterlacing sequences. The upsampled interlaced sequence is then filtered by the filter 23. In the frequency domain, the filter 23 is low pass in the vertical and time dimensions so that it has a diamond-shaped pass band as indicated by the shading in FIG. 5. Similarly, the upsampled deinterlacing sequence is filtered by the filter 24. The filter 24 is a high pass filter in the vertical and time dimensions so that it has a diamond-shaped stop band as indicated by the shading in FIG. 5. Both of the filters 23 and 24 have a finite impulse response and have simple finite precision coefficients.

After processing by the filters 23 and 24, the resulting signals are combined by the adder 25 to reconstruct the original progressive sequence in the vertical-time representation, thus providing a sequence which can be used by a high definition progressive television receiver.

The structure of the filters 12, 14, 23, 24 is discussed in greater detail below. In the following discussion, the filter 12 has the transfer function $H_0(z_1, z_2)$, where $z_1$ and $z_2$ are transform variables corresponding to the vertical and time dimensions. In the spatio-temporal representation, the transfer function is $h_0(n_1, n_2)$, where $n_1$ and $n_2$ are indices which correspond to the vertical and time coordinates. Thus, the location of any particular sample in the vertical-time time plane is given by identifying its vertical coordinate $n_1$ and its time coordinate $n_2$. Similarly, the filter 14 has the transfer function $H_1(z_1, z_2)$ corresponding to $h_1(n_1, n_2)$. The filter 23 has the transfer function $G_0(z_1, z_2)$ corresponding to $g_0(n_1, n_2)$ and the filter 24 has the transfer function $G_1(z_1, z_2)$ corresponding to $g_1(n_1, n_2)$.

If the input signal to the analysis filter bank 10 of FIG. 5 is represented by $X(z_1, z_2)$, then the output signal $X(z_1, z_2)$ from the synthesis filter bank is determined by $$X(z_1, z_2) = \tfrac{1}{2}(G_0(z_1, z_2) \cdot G_1(z_1, z_2)) \begin{pmatrix} H_0(z_1, z_2) & H_0(-z_1, -z_2) \\ H_1(z_1, z_2) & H_1(-z_1, -z_2) \end{pmatrix} \cdot \begin{pmatrix} X(z_1, z_2) \\ X(-z_1, -z_2) \end{pmatrix} \quad (1)$$

Aliasing cancellation is achieved by the choice $$G_0(z_1, z_2) = H_1(-z_1, z_2), \ G_1(z_1, z_2) = -H_0(-z_1, -z_2) \quad (2)$$

The analysis filters $H_1(z_1, z_2)$ and $H_2(z_1, z_2)$ can be decomposed into the following two polyphase components $$H_i(z_1, z_2) = H_{i0}(z_1^2, z_1 z_2) + z_1^{-1} H_{i1}(z_1^2, z_1 z_2), \ i = 0, 1 \quad (3)$$

The polyphase filter matrix associated with the analysis filter bank is given by $$H_p(z_1, z_2) = \begin{pmatrix} H_{00}(z_1, z_2) & H_{01}(z_1, z_2) \\ H_{10}(z_1, z_2) & H_{11}(z_1, z_2) \end{pmatrix} \quad (4)$$

Two cases of interest are when the polyphase filter matrix is paraunitary and when the polyphase filter matrix corresponds to linear phase filters.

The polyphase filter matrix is paraunitary when $$H_p^T(z_1^{-1}, z_2^{-1}) \cdot H_p(z_1, z_2) = I \quad (5)$$

In this case, approximately diamond-shaped filters (see FIG. 6A and 6B) may be generated by the following cascade structure:

$$H_p(z_1, z_2) = \begin{pmatrix} 1 & a_{2K-1} \\ -a_{2K-1} & 1 \end{pmatrix} \prod_{i=K-1}^{} \begin{pmatrix} 1 & z_1^{-1} z_2^{-1} \end{pmatrix} \cdot \begin{pmatrix} 1 & a_{2i+1} \\ -a_{2i+1} & 1 \end{pmatrix} \cdot \begin{pmatrix} 1 & z_1^{-1} z_2 \end{pmatrix} \cdot \begin{pmatrix} 1 \\ -a_{2i} & a_{2i} & 1 \end{pmatrix} \quad (6)$$

The smallest such filters obtained with K-1 in Eq (6) are:

$$h_0(n_1, n_2) = \begin{pmatrix} -a_1 a_2 - a_0 a_1 a_2 \\ 1 & a_0 & -a_0 a_2 a_2 \\ -a_0 a_1 & a_1 \end{pmatrix} \quad (7)$$

$$h_1(n_1, n_2) = \begin{pmatrix} -a_1 & -a_0a_1 \\ -a_2 & -a_0a_2 & -a_0 & 1 \\ a_0a_1a_2 - a_1a_2 & & & \end{pmatrix} \quad (8)$$

The reconstruction filters are the same (within reversal, see Eq (2)), except for a scaling factor of $1/\pi(1+a_i)^2$.

The filters of equations 7 and 8 are never linear phase. For linear phase behavior, the filters are centro-symmetric, that is:

$$z_1^{-K_1} z_2^{-K_2} H(z_1^{-1}, z_2^{-1}) = \pm H(z_1, z_2) \quad (9)$$

In this case, the polyphase matrices can be obtained from the following cascade structure $$H_p(z_1, z_2) = \quad (10)$$

$$\begin{pmatrix} 1 & 1 \\ 1 & -1 \end{pmatrix} \prod_{i=K}^{0} \begin{pmatrix} 1 & z_1^{-1}z_2^{-1} \\ z_1^{-1}z_2^{-1} & 1 \end{pmatrix} \begin{pmatrix} 1 & a_{2i+1} \\ a_{2i+1} & 1 \end{pmatrix} \begin{pmatrix} 1 & z_1^{-1}z_2 \\ z_1^{-1}z_2 & 1 \end{pmatrix} \begin{pmatrix} 1 & a_{2i} \\ a_{2i} & 1 \end{pmatrix}$$

The smallest possible filters given by the cascade structure of equation (10) are $$h_0(n_1, n_2) = \begin{pmatrix} a_0 & a_0a_1 \\ 1 & a_1 & a_1 & 1 \\ a_0a_1 & a_0 & & \end{pmatrix} \quad (11)$$

$$h_1(n_1, n_2) = \begin{pmatrix} -a_0 - a_0a_1 \\ 1 & a_1 & -a_1 & -1 \\ a_0a_1 & a_0 & & \end{pmatrix} \quad (12)$$

Illustratively, in equations (7), (8), (11), and (12), $a_0 = 2$, $a_1 = 0.5$ and $a_2 = 1$.

Like the paraunitary filters of equations (7) and (8), the filters of Eq (11) and (12) have only an approximate diamond shape. The filters of equations (11) and (12) have centro-symmetry but not left-right or top-bottom symmetry.

If perfect diamond-shaped filters with centro-symmetry as well as left-right and top-bottom symmetry are desired, different sized high and low pass filters are utilized.

For example, when the low pass filter has the form $$\begin{pmatrix} 1 \\ b & a & b \\ 1 & & \end{pmatrix} \quad (13)$$

and the high pass filter has the form $$\begin{pmatrix} 1 \\ b + c/aab + c/a \\ bc/a & c & d & c & bc/a \\ b + c/aab + c/a \\ 1 \end{pmatrix} \quad (14)$$

perfect reconstruction is achieved.

Cascades of the polyphase matrices corresponding to the filters of equations (13) and (14) can be used to generate larger filters retaining the same symmetry properties and still allowing perfect finite impulse response reconstruction. Illustratively, in the filters of equations 13 and 14, $b = 1$, $c = a$, $a = -4$, $d = -28$.

In short, filter banks have been described in terms of the filter transfer functions, which filter banks permit one to go from a progressive sequence in a vertical time representation to an interlaced sequence, and which allow perfect reconstruction of the progressive sequence. The filter banks can also be used to go from an interlaced to a progressive sequence and back. Illustratively, cascade structures are utilized to devise filter structures which are of linear phase or paraunitary, which have a low complexity, and which have a finite impulse response. Thus, the filter banks described above constitute an attractive way to provide a hierarchy of channels which can be used by television receivers of different resolutions. As can be seen in Eqs. 3, 4, 6, and 10, the transfer functions cannot be factored into a product of one-dimensional transfer functions, thereby making the transfer functions dimensionally non-separable.

Figure 7:
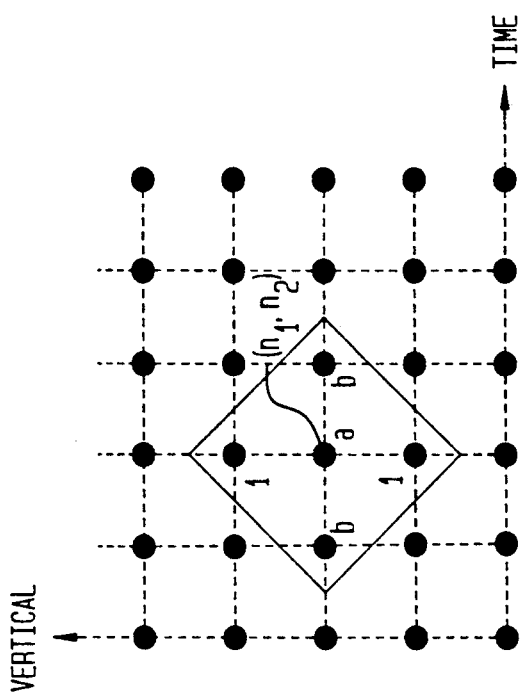
FIG. 7 illustrates the operation of one of the filters utilized in the filter bank of FIG. 3.

To understand how the filters described in equations (7), (8), (11), (12), (13), and (14) work, consider the example shown in FIG. 7. FIG. 7 shows how the filter of Eq (13) is applied to filter a video sequence. Thus, FIG. 7 shows a progressive video sequence in a vertical-time representation. The filter of Eq (13) is applied to each point in the vertical-time plane of FIG. 7. Thus, in FIG. 7 the filter of Eq (13) is superimposed over a particular sample $(n_1, n_2)$ in the vertical-time plane. To apply the filter of Eq (13) to the point $(n_1, n_2)$ in FIG. 7, the sample value at $(n_1, n_2)$ and the surrounding sample values are all weighted (i.e. multiplied) by the corresponding filter coefficients and then added to obtain a filtered sample value which is utilized in the output sequence in place of the input sample value at $(n_1, n_2)$.

Figure 8:
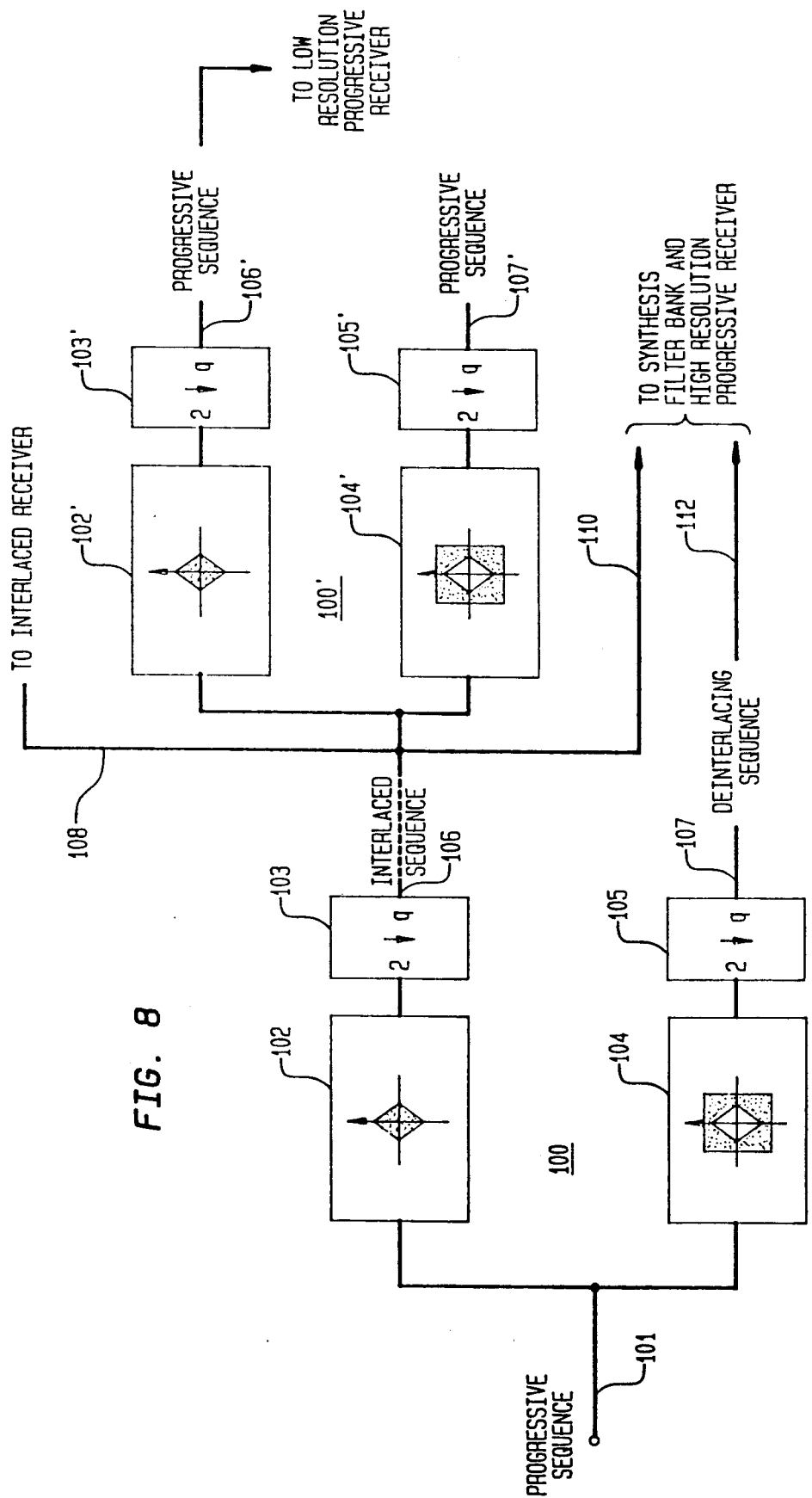
FIG. 8 illustrates the use of an additional filter bank to create a hierarchy of television sequences of different resolutions, in accordance with an illustrative embodiment of the present invention.

An alternative embodiment of the invention is illustrated in FIG. 8. In FIG. 8, a perfect reconstruction filter bank is applied twice to form a hierarchy of signals which can be utilized by receivers of different resolutions.

Illustratively, in FIG. 8, a high resolution progressive sequence in a vertical-time representation is applied to an input 101 of an analysis filter bank 100. The analysis filter bank 100 comprises the filters 102 and 104. The transfer functions of the filters 102, 104 may be given by equations (7), (8) or (11), (12) or (13), (14); i.e. the filters 102 and 104 are perfect reconstruction, diamond-shaped, finite impulse response, low complexity filters with simple finite precision filter coefficients. The output sequences of the filters 102 and 104 are quincunx subsampled as indicated by the boxes 103 and 105 to form an interlaced sequence at output 106 and a deinterlacing sequence at output 107.

As indicated by lines 110 and 112, the interlaced and deinterlacing sequences may be transmitted to a synthesis filter bank of the type described above to reconstruct the original high resolution progressive sequence at the input 101 for use by a high resolution progressive receiver. The interlaced sequence by itself may also be transmitted to a lower resolution interlaced receiver as indicated by the line 108.

In addition, the interlaced signal may be transmitted to a second analysis filter bank 100' identical to the filter bank 100 comprising filter and quincunx sampling elements 102', 103', 104', 105' to form two lower resolution progressive sequences (i.e. lower resolution than the interlaced sequence) at the outputs 106' and 107'. These lower resolution progressive sequences may be used by progressive receivers having a lower resolution than a receiver which utilizes the interlaced sequence. Thus, the filters of the present invention may be utilized to form a hierarchy of sequences from one single high resolution sequence, thereby permitting the high resolution sequence to be utilized by a variety of receivers of different resolutions.

Finally, the above-described embodiments of the invention are intended to be illustrative only. Numerous alternative embodiments may be devised by those skilled in the art without departing from the spirit and scope of the following claims.

What is claimed is:

1. A television signal transmitting system comprising a first filter bank comprising first and second finite impulse response filters with finite precision filter coefficients, said first filter being a low pass filter with a substantially diamond-shaped pass band and said second filter being a high pass filter with a substantially diamond-shaped stop band, said first filter bank receiving and decomposing a high resolution progressive video sequence in a two-dimensional vertical-time representation to produce an interlaced video sequence and a deinterlacing video sequence, said interlaced video sequence being capable of forming a low resolution television image in a low resolution television receiver, said interlaced and said deinterlacing video sequences being capable of being recombined by a second filter bank comprising third and fourth finite impulse response filters with finite precision filter coefficients to perfectly reconstruct said high resolution video sequence in said two-dimensional vertical-time representation for use by a high resolution television receiver, said third filter being a low pass filter with a substantially diamond-shaped pass band and said fourth filter being a high pass filter with a substantially diamond-shaped stopband, wherein the transfer functions of said first, second, third, and fourth filters are two dimensional and dimensionally non-separable.

2. The system of claim 1 wherein said first, second, third, and fourth filters are paraunitary.

3. The system of claim 1 wherein said first, second, third and fourth filters are linear phase.

4. The system of claim 3 wherein said first, second, third and fourth filters are linear phase and have left-right and top-bottom symmetry.

5. The system of claim 3 wherein said first, second, third and fourth filters are circular symmetric.

6. The system of claim 1 wherein said first filter bank includes first and second quincunx subsampling means associated with said first and second filters, respectively.

7. The system of claim 1, said second filter bank includes first and second upsampling means associated with said third and fourth filters, respectively.

8. The system of claim 3 wherein said first filter has a spatio-temporal transfer function of the form $$h_0(n_1, n_2) = \begin{pmatrix} & a_0 \ a_0 a_1 & \\ 1 & a_1 & a_1 & 1 \\ & a_0 a_1 \ a_0 & \end{pmatrix}$$

and wherein said second filter has a spatio-temporal transfer function of the form $$h_1(n_1, n_2) = \begin{pmatrix} & -a_0 - a_0 a_1 & \\ 1 & a_1 & -a_1 & -1 \\ & a_0 a_1 \ a_0 & \end{pmatrix}$$

wherein $a_0$, $a_1$ and $a_2$ are finite precision numbers.

9. The system of claim 4 where said first filter has a spatio-temporal transfer function of the form $$h_0(n_1, n_2) = \begin{pmatrix} & 1 & \\ b & a & b \\ & 1 & \end{pmatrix}$$

and wherein said second filter has a spatio-temporal transfer function of the form $$h_1(n_1, n_2) = \begin{pmatrix} & b + \frac{c}{a}\frac{1}{a}b + \frac{c}{a} & \\ \frac{bc}{a} & a & d & a & \frac{bc}{a} \\ & b + \frac{c}{a}\frac{a}{1}b + \frac{c}{a} & \end{pmatrix}$$

wherein a, b, c, and d are finite precision numbers.

10. The system of claim 2 wherein said first filter has a spatio-temporal transfer function of the form $$h_0(n_1, n_2) = \begin{pmatrix} & -a_1 a_2 - a_0 a_1 a_2 & \\ 1 & a_0 & -a_0 a_2 a_2 \\ & -a_0 a_1 & a_1 \end{pmatrix}$$

and wherein said second filter has a spatio-temporal transfer function of the form $$h_1(n_1, n_2) = \begin{pmatrix} & -a_1 & -a_0 a_1 & \\ -a_2 & -a_0 a_2 & -a_0 & 1 \\ & a_0 a_1 a_2 - a_1 a_2 & \end{pmatrix}$$

wherein $a_0$, $a_1$ and $a_2$ are finite precision numbers.

11. The system of claim 1 wherein said system further comprises a third filter bank comprising fifth and sixth finite impulse response filters with finite precision coefficients for receiving said interlaced television signal in a two-dimensional vertical-time representation and for outputting first and second low resolution progressive video signals, said fifth filter being a low pass filter with a substantially diamond-shaped pass band and said sixth filter being a high pass filter with a substantially diamond-shaped stop band.

12. A television system comprising
a first filter bank comprising first and second finite impulse response filters with finite precision filter coefficients, said first filter being a low pass filter with a substantially diamond-shaped pass band and said second filter being a high pass filter with a substantially diamond-shaped stop band,
said first filter bank receiving a high resolution video sequence in a two-dimensional vertical-time representation and producing first and second low resolution video sequences in a vertical-time representation, said first low resolution video sequence being capable of forming a low resolution television image on a low resolution television receiver, and means for recombining said first and second low resolution video sequences, said recombining means comprising a second filter bank including third and fourth finite impulse response filters with finite precision filter coefficients to substantially perfectly reconstruct said high resolution sequence in said two-dimensional vertical-time representation for use by a high resolution television receiver, said third filter being a low pass filter with a substantially diamond-shaped pass band and said fourth filter being a high pass filter with a substantially diamond-shaped stop band, wherein the transfer functions of said first, second, third, and fourth filters are in two-dimensional form and are dimensionally non-separable.

13. The system of claim 12 wherein said high resolution video sequence is a progressive sequence and said first and second low resolution video sequences are an interlaced and a deinterlacing sequence, respectively.

14. The system of claim 12 wherein said high resolution video sequence is an interlaced sequence and said first and second low resolution video sequences are progressive sequences.

15. The system of claim 12 wherein said first, second, third and fourth filters are linear phase.

16. The system of claim 12 wherein said first, second, third and fourth filter are paraunitary.

17. A television signal receiving system comprising a synthesis filter bank comprising first and second finite impulse response filters with finite precision filter coefficients, said first filter being a low pass filter with a substantially diamond-shaped pass band and said second filter being a high pass filter with a substantially diamond-shaped stop band, said first filter receiving and filtering a first low resolution low frequency video sequence in a two-dimensional vertical-time representation to form a first output sequence in a vertical-time representation, said second filter receiving and filtering a second low resolution high frequency video sequence in a two-dimensional vertical-time representation to form a second output sequence in a vertical-time representation, said first and second low resolution video sequences being formed as result of the decomposition of a single high resolution video sequence, said filter bank comprising means for combining said first and second output sequences to perfectly reconstruct said high resolution video sequence and said transfer functions of said first and second filters are two dimensional and dimensionally non-separable.

18. The system of claim 14 wherein said first low resolution video sequence is an interlaced sequence, said second low resolution video sequence is a deinterlacing sequence, and said high resolution video sequence is a progressive sequence.

19. A filter bank for use in a high definition television system comprising a first, low pass, finite impulse response, liner phase filter having a transfer function of the form $$h_0(n_1, n_2) = \begin{pmatrix} & a_0 & a_0 a_1 & \\ 1 & a_1 & a_1 & 1 \\ & a_0 a_1 & a_0 & \end{pmatrix}$$

and a second, high pass, finite impulse response, linear phase filter having a transfer function of the form $$h_1(n_1, n_2) = \begin{pmatrix} & -a_0 - a_0 a_1 & \\ 1 & a_1 & -a_1 & -1 \\ & a_0 a_1 & a_0 & \end{pmatrix}$$

wherein $a_0$, $a_1$ and $a_2$ are finite precision numbers, said first and second filters of said filter bank cooperating to process one or more video sequences inputted to said filter bank, such that the video sequence is perfectly reconstructed, and said transfer functions of said first and second filters being two dimensional and dimensionally non-separable.

20. A filter bank for use in a high definition television system comprising a first, low pass, finite impulse response, linear phase filter having a transfer function of the form $$h_0(n_1, n_2) = \begin{pmatrix} 1 \\ b\ a\ b \\ 1 \end{pmatrix}$$

and a second, high pass, finite impulse response, linear phase filter having a transfer function of the form $$h_1(n_1, n_2) = \begin{pmatrix} & b + \frac{c}{a}\frac{1}{a}b + \frac{c}{a} & \\ \frac{bc}{a} & a\ d\ a & \frac{bc}{a} \\ & b + \frac{c}{a}\frac{a}{1}b + \frac{c}{a} & \end{pmatrix}$$

wherein a, b, c, and d are finite precision numbers, said first and second filters of said filter bank cooperating to procress one or more video sequences inputted to said filter bank, such that the video sequence is perfectly reconstructed and said transfer functions of said first and second filters being two dimensional and dimensionally non-separable.

21. A filter bank for use in a high definition television system comprising a first, low pass, finite impulse response filter having a transfer function of the form $$h_0(n_1, n_2) = \begin{pmatrix} & -a_1 a_2 - a_0 a_1 a_2 & \\ 1 & a_0 & -a_0 a_2 a_2 \\ & -a_0 a_1 & a_1 \end{pmatrix}$$

and a second, high pass, finite impulse response filter having a transfer function of the form $$h_1(n_1, n_2) = \begin{pmatrix} & -a_1 & -a_0 a_1 \\ -a_2 & -a_0 a_2 & -a_0 \; 1 \\ a_0 a_1 a_2 - a_1 a_2 & & \end{pmatrix}$$

wherein $a_0$, $a_1$ and $a_2$ are finite precision numbers,
said first and second filters being paraunitary,
said first and second filters cooperating to process one or more video sequences inputted to said filter bank, such that the video sequence is perfectly reconstructed, and said transfer functions of said first and second filters being two dimensional and dimensionally non-separable.

22. A television signal transmitting system comprising a first filter bank comprising first and second finite impulse response filters with finite precision filter coefficients, said first filter being a low pass filter with a substantially diamond-shaped pass band and said second filter being a high pass filter with a substantially diamond-shaped stop band, said first filter bank receiving and decomposing a high resolution progressive video sequence in a multi-dimensional representation to produce an interlaced video sequence and a deinterlacing video sequence, said interlaced video sequence being capable of forming a low resolution television image in a low resolution television receiver, said interlaced and said deinterlacing video sequences being capable of being recombined by a second filter bank comprising third and fourth finite impulse response filters with finite precision filter coefficients to perfectly reconstruct said high resolution video sequence in said multi-dimensional representation for use by a high resolution television receiver, said third filter being a low pass filter with a substantially diamond-shaped pass band and said fourth filter being a high pass filter with a substantially diamond-shaped stopband, wherein the transfer functions of said first, second, third, and fourth filters are multi-dimensional and dimensionally non-separable.

* * * * *